United States Patent
Karp et al.

(10) Patent No.: US 6,266,269 B1
(45) Date of Patent: Jul. 24, 2001

(54) THREE TERMINAL NON-VOLATILE MEMORY ELEMENT

(75) Inventors: James Karp, Saratoga; Daniel Gitlin, Sunnyvale; Shahin Toutounchi, Pleasanton, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/589,337

(22) Filed: Jun. 7, 2000

(51) Int. Cl.[7] .................................................. G11C 11/24
(52) U.S. Cl. .............................. 365/150; 365/96; 365/187
(58) Field of Search ....................................... 365/149, 150, 365/96, 104, 187

(56) References Cited

U.S. PATENT DOCUMENTS

| | | | | |
|---|---|---|---|---|
| 5,646,903 | * | 7/1997 | Johnson | 365/230.05 |
| 5,737,261 | * | 4/1998 | Taira | 365/145 |
| 5,796,650 | * | 8/1998 | Wik et al. | 365/150 |
| 5,808,932 | * | 9/1998 | Irrinki et al. | 365/150 |

* cited by examiner

Primary Examiner—Son Mai
(74) Attorney, Agent, or Firm—Bever, Hoffman & Harms, LLP; Jeanette S. Harms; Lois D. Cartier (57) ABSTRACT

A three terminal non-volatile memory element includes a standard (low voltage) CMOS transistor, i.e. a storage transistor, having a drain coupled to a read bit line and a source connected to ground. The storage transistor is programmed by applying a high programming voltage to its gate, thereby rupturing the gate oxide of the storage transistor. Of importance, in submicron technology, the source and drain regions of the storage transistor merge, thereby providing a highly reliable, conductive path. Thus, the state of the memory cell can be advantageously read solely via the read bit line.

19 Claims, 4 Drawing Sheets

THREE TERMINAL NON-VOLATILE MEMORY ELEMENT

BACKGROUND OF THE INVENTION

1. Field of the Invention

The present invention relates to a non-volatile memory cell, and particularly to a three terminal memory element using a standard CMOS transistor.

2. Description of the Related Art

MOS (metal oxide semiconductor) transistors are well known in the art. An MOS transistor includes a source and a drain, formed as diffusion areas in the substrate, as well as a channel region extending between the source and drain. A gate, typically a polycrystalline silicon structure, is formed overlying the substrate. A gate oxide, formed with silicon dioxide layer, is provided between the gate and the channel region. A predetermined voltage on the gate creates the channel, which connects the source and drain. Thus, by controlling the voltage, an MOS device can be used as a switch having an ON or OFF state.

If the source and drain are N type formed in a P type substrate, then the MOS transistor is called an NMOS device. In a similar manner, if the source and drain are P type formed in a N type substrate, then the MOS transistor is called a PMOS device. A complementary metal oxide semiconductor (CMOS) integrated circuit includes both NMOS and PMOS transistors.

Static random access memory (SRAM) cells are well known, volatile memory cells fabricated using (CMOS) technology. Volatile memory cells lose their stored information when power is removed from the circuit. In this manner, SRAM cells can be easily reprogrammed to a different logic state. However, an unexpected loss of power requires reprogramming of the SRAM cells.

In contrast, non-volatile memory cells preserve their stored information even if power is removed. Moreover, many applications for integrated circuits require the security provided by non-volatile memory cells. Therefore, it would be desirable for integrated circuits to include both non-volatile and volatile memory cells, thereby providing the end user with optimal flexibility as well as security.

However, conventional, non-volatile memory cells are substantially different from those used in typical, volatile memory cells, thereby requiring different fabrication techniques. Thus, if non-volatile memory cells are included on an integrated circuit fabricated using conventional CMOS technology, then chip size and complexity are undesirably increased.

Figure 1A:
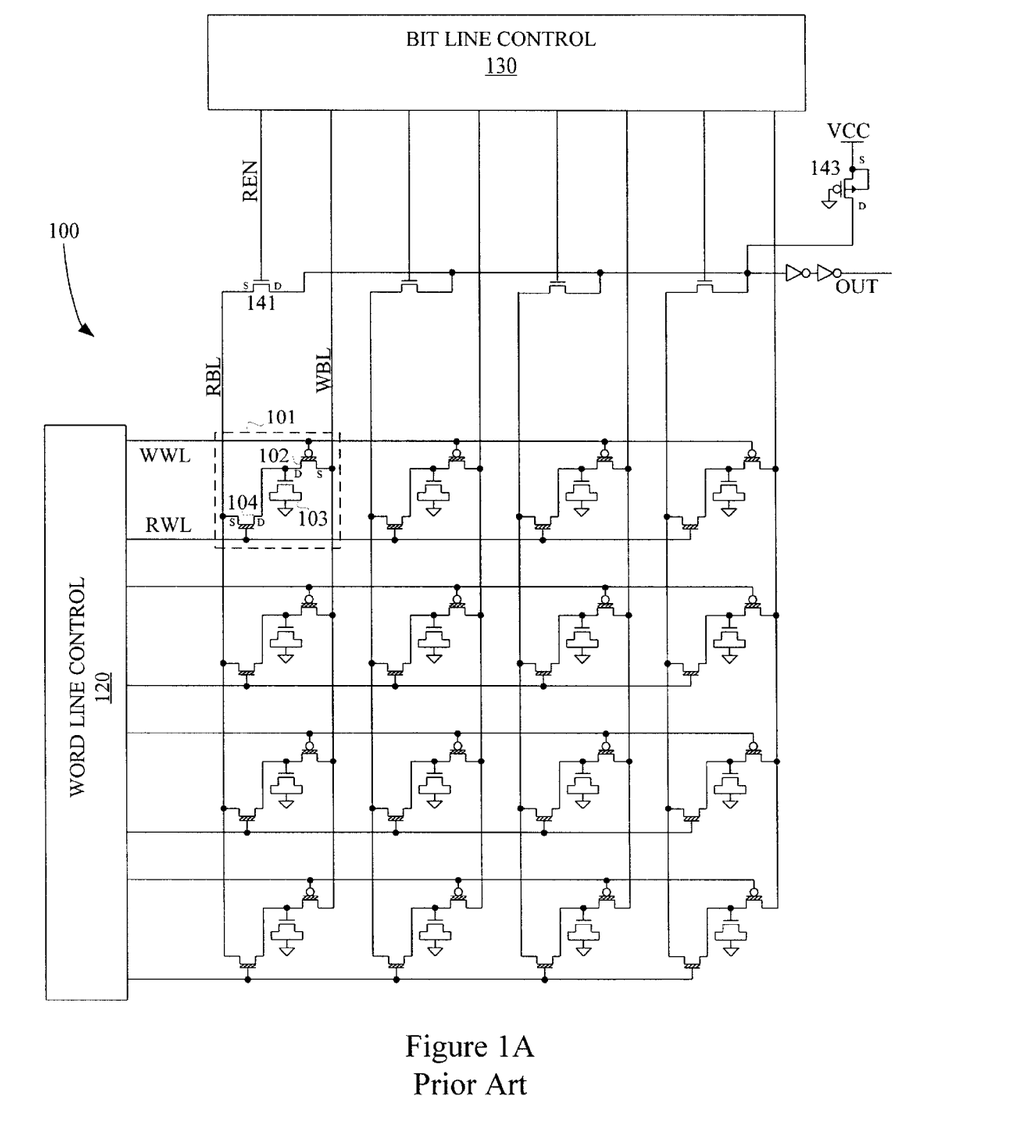
FIG. 1A is a schematic diagram of a known memory system.

FIG. 1A illustrates a known memory system 100 located on an integrated circuit with other circuitry (not shown). This circuitry can include, for example, circuitry relating to a field programmable gate array (FPGA). In one embodiment, memory system 100, which includes both low voltage and high voltage transistors, is fabricated in accordance with a 0.18 µm CMOS process. The low voltage transistors are designed to operate in response to a supply voltage of 1.8 Volts, whereas the high voltage transistors are designed to operate in response to a supply voltage of 3.3 Volts.

Memory system 100 includes an illustrative 4×4 array of memory cells 101, each memory cell 101 including a write access transistor 102, a storage transistor 103, and a read access transistor 104. Storage transistors 103 are low voltage NMOS transistors having a gate oxide thickness of 40 Å, a channel width of 0.6 µm and a channel length of 0.25 µm. Write access transistors 102 are high voltage PMOS transistors having a gate oxide thickness of 70 Å, a channel width of 1 µm and a channel length of 0.6 µm. In contrast, read access transistors 104 are high voltage NMOS transistors having a gate oxide thickness of 70 Å, a channel width of 10 µm and a channel length of 0.6 µm.

Storage transistor 103 is programmed by applying a programming voltage (VPP) across its gate oxide layer, thereby rupturing this layer. When the gate oxide is ruptured, a conductive path is formed between the gate, source, and drain of the storage transistor. If the gate oxide of a storage transistor is not ruptured, then no such conductive path exists. In the embodiment of FIG. 1, the drain and source of the storage transistor are connected to ground. Thus, to apply the programming voltage VPP across the gate oxide layer, a programming voltage VPP is applied to the gate of storage transistor 103.

The programming voltage VPP is applied to the gate of storage transistor 103 through write access transistor 102. However, the breakdown voltage of write access transistor 102 is at least 1.5 Volts higher than the breakdown voltage of read access transistor 104. In this manner, the high breakdown voltage of write access transistor 102 allows the use of a relatively high programming voltage VPP.

Figure 1B:
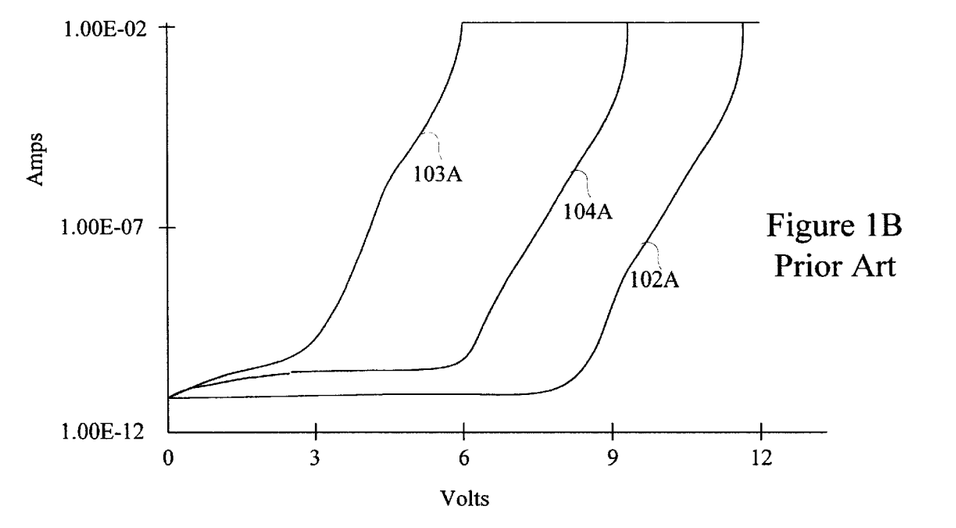
FIG. 1B is a graph of illustrating the breakdown characteristics of a low voltage n-channel transistor, a high voltage n-channel transistor, and a high voltage p-channel transistor.

FIG. 1B illustrates the breakdown characteristics of a high voltage PMOS transistor (such as write access transistor 102), a low voltage NMOS transistor (such as storage transistor 103), and a high voltage NMOS (such as read access transistor 104). The breakdown characteristics of transistors 102, 103, and 104 are shown by lines 102A, 103A and 104A, respectively.

As illustrated by line 103A, the low voltage NMOS transistor has a breakdown voltage of about 6 Volts. However, as illustrated by line 104A, at 6 Volts, the high voltage NMOS transistor operates in a Fowler-Nordheim tunneling region, which may harm its gate oxide. (The Fowler-Nordheim tunneling region begins at the knee of the curve in line 104A.) Consequently, it is undesirable to use a high voltage NMOS transistor as a write access transistor.

As illustrated by line 102A, a high voltage PMOS transistor does not begin to operate in the Fowler-Nordheim tunneling region until about 7.5 to 8 Volts. Thus, there is a safe operating margin that exists between the breakdown voltage of a low voltage NMOS transistor (such as storage transistor 103), and the Fowler-Nordheim tunneling region of a high voltage PMOS transistor (such as write access transistor 102). This margin enables write access transistor 102 to safely transfer the programming voltage VPP.

Referring back to FIG. 1A, the memory cells in each row are coupled to a common write word line (WWL) and a common read word line (RWL). Similarly, the memory cells in each column are coupled to the common read bit line (RBL) and a common write bit line (WBL). Word line control circuit 120 generates the read and write enable signals to be applied to read word lines RWL and write word lines WWL, respectively. Bit line control circuit 130 generates the program signals to be applied to write bit lines WBL and the read enable signals REN. Detailed descriptions of word line control circuit 120 and bit line control circuit 130 are provided in U.S. patent application, Ser. No. 09/263,375, filed on Mar. 5, 1999, which is incorporated by reference herein.

Write Operation

To program a specific memory cell 101, word line control circuit 120 asserts a supply voltage VCC on the write word line WWL of the addressed row. Bit line control circuit 130 then asserts the programming voltage VPP on the write bit line (WBL) of the addressed column. Under these conditions, write access transistor 102 turns on, thereby applying the programming voltage VPP to the gate of storage transistor 103. Under these conditions, the gate oxide of storage transistor 103 is ruptured, thereby programming that memory cell.

Word line control circuit 120 further applies the VCC supply voltage to all read word lines RWL. Thus, the gate-to-drain voltage of read access transistor 104 in the programmed memory cell is limited to a voltage that does not exceed the programming voltage VPP minus the VCC supply voltage. Note that this voltage is only applied until the programming operation is complete (i.e., the gate oxide is ruptured). At this time, the gate-to-drain voltage is approximately VCC. Consequently, the gate oxide of read access transistor 104 in the programmed cell is not damaged during a programming operation.

Bit line control circuit 130 provides the VCC supply voltage to all of the write bit lines WBL in the non-addressed columns. As a result, except for the addressed memory cell, the gates and sources of write access transistors 102 in the addressed row are held at the same voltage (i.e. VCC). Consequently, those transistors are turned off, and the associated storage transistors 103 are not programmed.

Word line control circuit 120 further provides the programming voltage VPP on the write word lines WWL of the non-addressed rows. As a result, except for the addressed memory cell, the gates and the sources of the write access transistors 102 in the addressed column are held at the same voltage (VPP). Consequently, those transistors remain turned off, and the associated storage transistors 103 are not programmed.

Note that the gates of write access transistors 102 in the non-addressed rows and columns are held at the programming voltage of VPP, whereas the sources of these transistors are held at the VCC supply voltage. Because the gate voltages are greater than the source voltages, these transistors are turned off and the associated storage transistors 103 are not programmed.

Bit line control circuit 130 further provides read enable signals REN having a voltage of 0 Volts during a program operation. Consequently, read output transistors 141 are not turned on during a programming operation. Therefore, read bit lines RBL are left floating.

Table 1 summarizes the various voltages applied to the addressed and non-addressed rows and columns during a write operation.

TABLE 1

|  | Addressed Row | Non-Addressed Row | Addressed Column | Non-Addressed Column |
| --- | --- | --- | --- | --- |
| WWL | 1.8 V | 8 V | — | — |
| RWL | 1.8 V | 1.8 V | — | — |
| WBL | — | — | 8 V | 1.8 V |
| REN | — | — | 0 V | 0 V |
| RBL | — | — | Float | Float |

Read Operation

During a read operation, word line control circuit 120 provides the VCC supply voltage to all write word lines WWL, and bit line control circuit 130 provides 0 Volts to all write bit lines WBL, thereby turning off all write access transistors 102. The gate of pull-up transistor 143 is coupled to ground, thereby turning on that transistor and weakly pulling up the voltages on the drains of transistors 141 to the VCC supply voltage. To read the state of a specific memory cell 101, bit line control circuit 130 asserts the VCC supply voltage on the read enable line REN associated with the addressed column. Under these conditions, read output transistor 141 in the addressed column turns on, thereby coupling the associated read bit line RBL to the drain of pull-up transistor 143.

Bit line control circuit 130 provides 0 Volts on read enable lines REN associated with non-addressed columns. Consequently, transistors 141 in the non-addressed columns are turned off, thereby leaving their associated read bit lines RBL floating.

Word line control circuit 120 provides 0 Volts to all of the row word lines RWL in the non-addressed rows. Therefore, read access transistors 104 in the non-addressed rows are turned off, thereby preventing the associated memory cells 103 from being read.

To read the addressed memory cell 101, word line control circuit 120 asserts the supply voltage VCC on the read word line RWL of the addressed row. Under these conditions, read access transistor 104 turns on, thereby coupling the gate of storage transistor 103 to read bit line RBL.

If storage transistor 103 is programmed, a conductive path will exist through storage transistor 103. Under these conditions, storage transistor 201 will overcome the weak pull up provided by pull-up transistor 143 and pull down the voltage on read bit line RBL to approximately 0 Volts. As a result, memory system 100 provides a logic low output signal OUT.

Conversely, if storage transistor 103 is not programmed, no conductive path exists through storage transistor 103. Under these conditions, with no active pull down, pull-up transistor 143 pulls up the voltage of read bit line RBL to approximately VCC. Therefore, memory system 100 provides a logic high output signal OUT.

Table 2 summarizes the various voltages applied to the addressed and non-addressed rows and columns during a read operation.

TABLE 2

|  | Addressed Row | Non-Addressed Row | Addressed Column | Non-Addressed Column |
| --- | --- | --- | --- | --- |
| WWL | 1.8 V | 1.8 V | — | — |
| RWL | 1.8 V | 0 V | — | — |
| WBL | — | — | 0 V | 0 V |
| REN | — | — | VCC | 0 V |
| RBL | — | — | Coupled to Output Line | Float |

Under certain conditions, a programmed storage transistor 103 may begin to self-repair. Specifically, during programming the gate oxide is ruptured, thereby allowing some of the material associated with the gate of the storage transistor to collapse into the area overlying the channel region of the storage transistor. In this manner, some portion of the gate is fused with the source and drain of the storage transistor. The original ON state resistance of the cell depends on the programming current. In the embodiment described above, an ON state resistance of 10–50 kOhms is typical.

However, if the memory cell is repeatedly read, the fuse begins to deteriorate, thereby increasing the ON state resistance of the cell. In time, the fuse may deteriorate completely, thereby separating the gate from either the source or the drain regions. At this point, a programmed memory cell in the embodiment of FIG. 1 actually reads as an unprogrammed memory cell and cannot be reprogrammed.

Therefore, a need arises for a reliable, non-volatile memory cell formed using standard CMOS processes.

SUMMARY OF THE INVENTION

The memory cell of the present invention includes a low voltage transistor having a drain coupled to a read bit line and a source connected to ground. This low voltage transistor, called a storage transistor, is programmed by applying a high programming voltage to its gate. Of importance, during programming of the storage transistor of the present invention implemented in submicron technology, the diffusion regions (i.e. source and drain) of the storage transistor merge, thereby providing a highly reliable conductive path between the drain and the source of the storage transistor. Therefore, in accordance with the present invention, the ON state resistance of the storage transistor is read from the drain terminal, rather than from the gate terminal as provided in the prior art. Thus, a programmed storage transistor of the present invention reliably reads as programmed irrespective of the number of read operations performed.

The present invention also advantageously provides full scalability. Specifically, after a technology shrink, the channel length (i.e. distance between the source and the drain) of the storage transistor will decrease. Therefore, performing a technology shrink actually increases the probability that merging of the source and drain diffusion areas will occur during programming. Thus, the memory cell of the present invention provides even more reliability with a decrease in feature size.

In accordance with one embodiment of the present invention, the high programming voltage is applied to the storage transistor via a high voltage, write transistor. The write transistor has a thicker gate oxide than the storage transistor. In one embodiment, the gate oxide of the write transistor has a thickness of approximately 70 angstroms, and the storage transistor has a gate oxide with a thickness of approximately 25 angstroms. In other embodiments, the gate oxide thickness of the storage transistor is between approximately 15 to 40 angstroms.

A high voltage transistor has a higher breakdown voltage than a low voltage transistor having the same size. Thus, a relatively high programming voltage can be safely provided through the write transistor. The state of the storage transistor is determined via the read bit line. In one embodiment, the storage transistor is read via a high voltage, read transistor having a gate oxide thickness of approximately 70 angstroms.

During a program operation, the write and read transistors are turned on. A logic low, i.e. ground, signal is provided via the read transistor to the drain of the storage transistor. Then, a programming voltage is provided via the conducting write transistor to the gate of the storage transistor.

The storage transistor is read by turning off the write transistor, turning on the read transistor, providing a weak pull-up to the output line of the memory array, and connecting the output line to the conducting read transistor. If the storage transistor is programmed, then it will pull the output voltage down to ground.

As a further advantage of the present invention, all transistors in a memory cell array, i.e. both low voltage and high voltage, are standard CMOS devices. In one embodiment, the low voltage, storage transistor is an NMOS device, the high voltage, write transistor is a PMOS device, and the high voltage, read transistor is an NMOS device. Therefore, the memory cell array of the present invention can be fabricated using standard CMOS processing.

The present invention will be more fully understood in view of the following description and drawings, in which similar elements are labeled with similar reference numerals.

DETAILED DESCRIPTION OF THE DRAWINGS

Figure 3A:
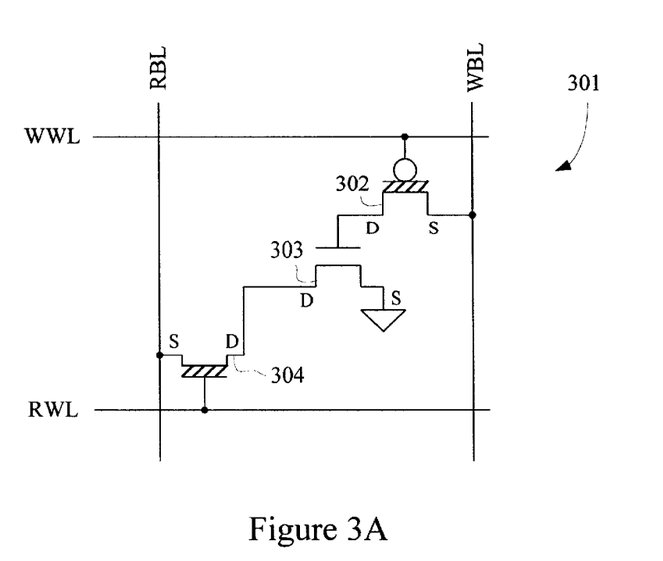
FIG. 3A is a schematic diagram of a memory cell in accordance with one embodiment of the present invention.

FIG. 3A illustrates one embodiment of a memory cell 301 in accordance with the present invention. Memory cell 301 includes a write access transistor 302, a storage transistor 303, and a read access transistor 304. In one embodiment, write access transistor 302 is a high voltage PMOS transistor having a gate oxide thickness of 70 Å, a channel width of 1 μm, and a channel length of 0.6 μm. In contrast, read access transistor 104 in this embodiment is a high voltage NMOS transistor having a gate oxide thickness of 70 Å, a channel width of 10 μm, and a channel length of 0.6 μm. Finally, storage transistor 303 is a low voltage NMOS device having a gate oxide thickness of 25 Å, a channel width of 0.6 μm, and a channel length of 0.25 μm. In other embodiments, the gate oxide thickness of transistor 303 is between approximately 15 Å and 40 Å.

Storage transistor 303 has its drain coupled to a first voltage source, ground. Write transistor 302 has its drain coupled to the gate of storage transistor 303. Read transistor 304 has its drain coupled to the drain of storage transistor 303.

As explained in further detail below, memory cell 301 is programmed by turning on write transistor 302 and read transistor 304. A logic low, i.e. ground, signal is provided via read transistor 304 to the drain of storage transistor 303. Then, a programming voltage is provided via conducting write transistor 302 to the gate of storage transistor 303, thereby rupturing its gate oxide. Memory cell 301 is read by turning off write transistor 302 and turning on read transistor 304. If memory cell 301 is programmed, then storage transistor 303 will provide a logic low signal.

Of importance, during programming of storage transistor 303 in submicron technology (i.e. typically at or below 0.18 microns), Applicants have found that the diffusion areas of storage transistor 303 (i.e. the source and the drain) merge, thereby creating a stable conductive path between the source and the drain. This merged diffusion area is not formed in prior art storage transistors.

Figure 2A:
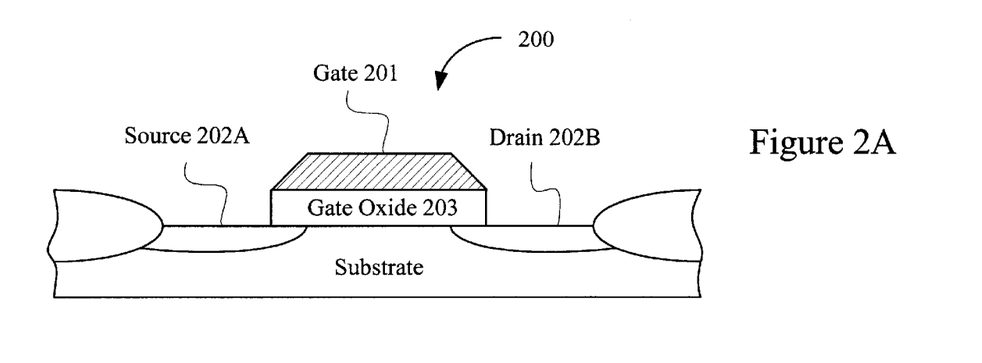
FIG. 2A is a cross section of a known, unprogrammed storage transistor.
Figure 2B:
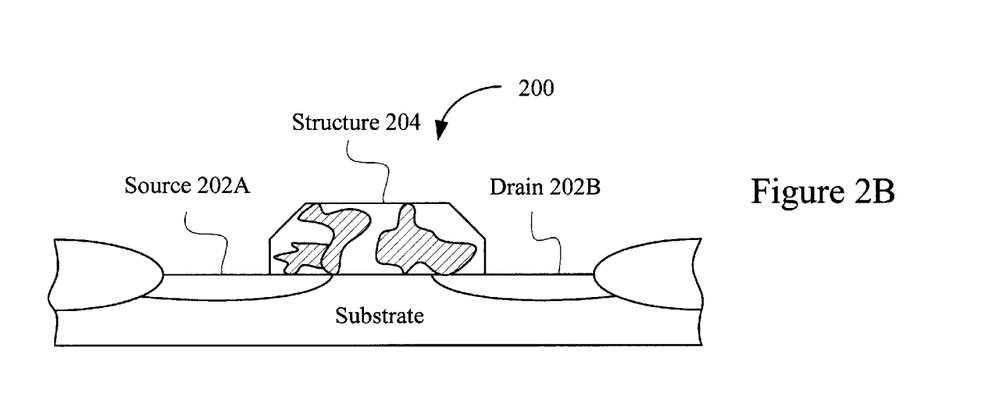
FIG. 2B is a cross section of a known programmed storage transistor.

FIG. 2A illustrates a cross section of a known, unprogrammed storage transistor 200 (see, for example, storage transistor 103 in FIG. 1A) having a gate 201, a source region 202A, and a drain region 202B. During programming, gate oxide 203 is ruptured, thereby forming a structure 204 having fused conductive and non-conductive portions as shown in FIG. 2B. Note that the diffusion areas for source 202A and drain 202B have further diffused in the channel region, but do not overlap. Thus, the ON state resistance as determined from a gate terminal (not shown) is totally dependent upon the positioning of the conductive portions in structure 204. As known by those skilled in the art, these conductive portions tend to move and break apart during subsequent read operations, thereby adversely affecting the ON state resistance and eventually causing the programmed cell to read as an unprogrammed cell.

Figure 2C:
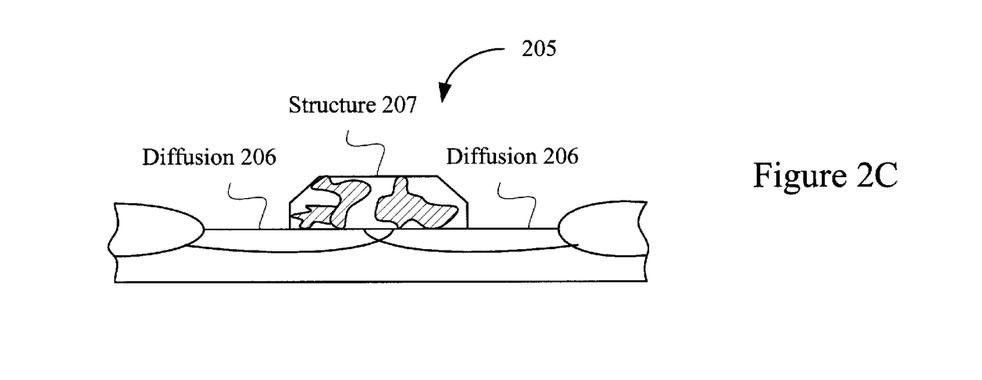
FIG. 2C is a cross section of a programmed storage transistor of the present invention.

In contrast, FIG. 2C illustrates a programmed storage transistor 205 in accordance with the present invention implemented in submicron technology. In this submicron implementation, the source and drain regions merge into a single diffusion area 206 during the high temperature conditions present during programming. Note that the ruptured gate oxide also forms a structure 207 having fused conductive and non-conductive portions. However, in accordance with the present invention, irrespective of any movement or breaking apart of the conductive portions within structure 207 after subsequent read operations, diffusion area 206 provides a permanent conductive path.

Thus, in accordance with the present invention, the ON state resistance of storage transistor 303 is determined from drain to source, rather from gate to source/drain as in the prior art. Therefore, a programmed memory cell in the present invention reliably reads as programmed irrespective of the number of read operations performed.

The present invention also advantageously provides full scalability. As known by those skilled in the art, in a technology shrink, all features of a device are typically reduced. Therefore, after a technology shrink, the channel length (i.e. the distance between the source and the drain diffusion areas) of the storage transistor will decrease. It logically follows that performing a technology shrink actually increases the probability that merging of the source and drain diffusion areas will occur during programming. Thus, the memory cell of the present invention provides even more reliability with a decrease in feature size.

Figure 3B:
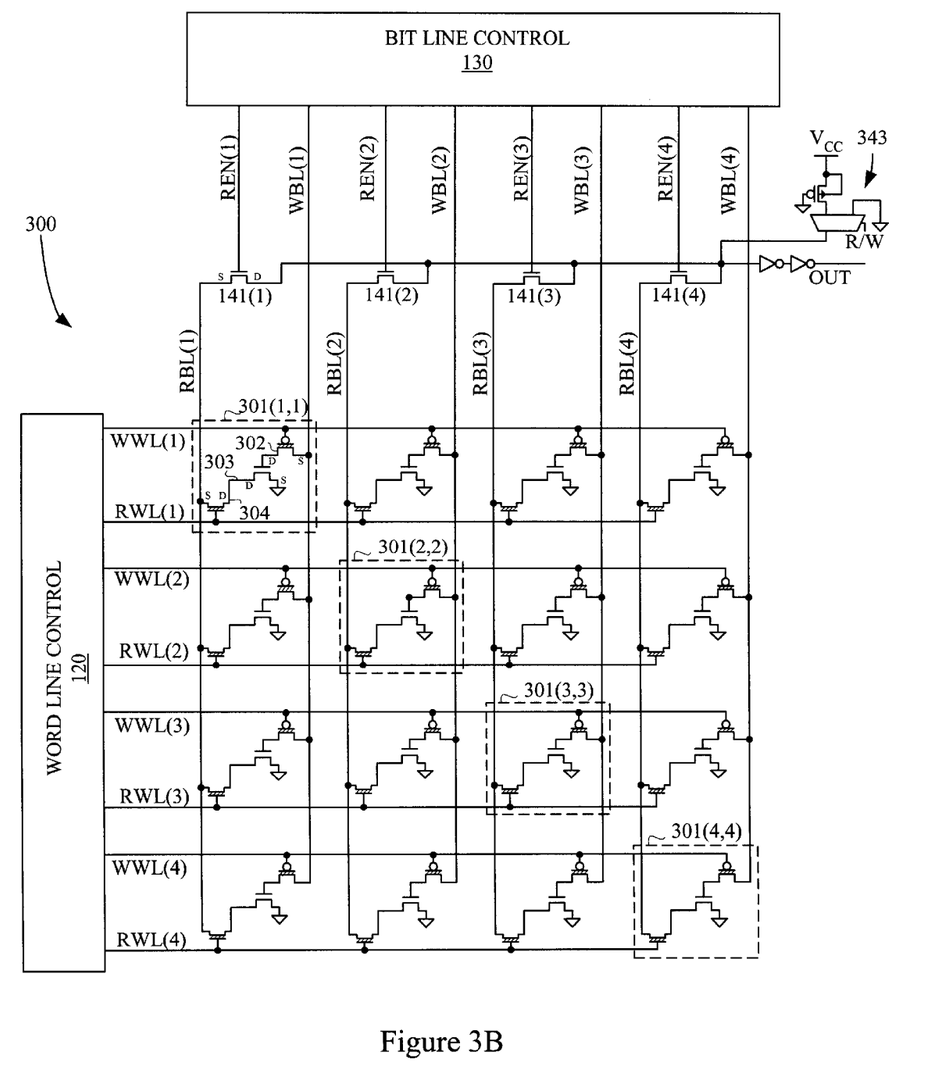
FIG. 3B is a schematic diagram of a memory system in accordance with the present invention.

FIG. 3B illustrates one embodiment of a memory system 300 including a plurality of memory cells 301(X,Y), wherein X indicates the row and Y indicates the column in the array. Although only eight memory cells are shown, an actual array may include hundreds or even thousands of memory cells. Moreover, memory system 300 may be provided on an integrated circuit having additional circuits (not shown) with associated functionality.

Note that transistor 143 (FIG. 1A) is replaced with a multiplexer system 343 that selectively provides a weak pull-up signal VCC or a ground signal. A control signal R/W, provided by bit line control circuit 130 in one embodiment, controls multiplexer 343.

Write Operation

To program a specific memory cell, such as memory cell 301(2,2), multiplexer system 343 is set to output a logic low (i.e. ground) signal. Then, word line control circuit 120 asserts a supply voltage VCC on write word line WWL(2) and on read word line RWL(2). Bit line control circuit 130 subsequently asserts the programming voltage VPP on write bit line WBL(2) and the supply voltage VCC on read enable line REN(2). In this manner, enable transistor 141(2) turns on, thereby connecting the source of the access transistor 303 in memory cell 301(2,2) to ground. Furthermore, the write access transistor 302 and the read access transistor 304 in memory cell 301(2,2) also turn on, thereby connecting the source of storage transistor 303 to ground and applying the programming voltage VPP to the gate of storage transistor 302. Under these conditions, the gate oxide of storage transistor 303 is ruptured, thereby programming memory cell 301(2,2).

Note that during a write operation, the gate-to-drain voltage of read access transistor 304 in memory cell 301(2, 2) is limited to a voltage that does not exceed the programming voltage VPP minus the VCC supply voltage. Moreover, this voltage is only applied until the programming operation is complete (i.e., the gate oxide is ruptured). At this time, the gate-to-drain voltage drops to VCC. Consequently, the gate oxide of read access transistor 304 in a programmed cell is not damaged.

During a write operation, bit line control circuit 130 provides the VCC supply voltage to all of the write bit lines WBL in the non-addressed columns. As a result, except for memory cell 301(2,2), the gates and sources of write access transistors 302 in the addressed row are held at the same voltage (VCC). Consequently, those transistors are turned off, and the associated storage transistors 303 are not programmed.

Word line control circuit 120 further provides the programming voltage VPP on the write word lines WWL of the non-addressed rows. As a result, except for memory cell 301(2,2), the gates and the sources of the write access transistors 302 in the addressed column are held at the same voltage (VPP). Consequently, those transistors remain turned off, and the associated storage transistors 303 are not programmed.

Because the gates of the write access transistors 302 in the non-addressed rows are held at the programming voltage of VPP, whereas the sources of these transistors in the non-addressed columns are held at the VCC supply voltage, these write access transistors 302 are turned off and the associated storage transistors 303 are not programmed.

Bit line control circuit 130 further provides read enable signals REN having a voltage of 0 Volts for non-addressed columns during a write operation. Consequently, the associated read enable transistors 141 are not turned on during a write operation. Therefore, the read bit lines RBL for non-addressed columns are left floating.

Table 3 summarizes the various voltages applied to the addressed and non-addressed rows and columns during a write operation.

TABLE 3

|  | Addressed Row | Non-Addressed Row | Addressed Column | Non-Addressed Column |
| --- | --- | --- | --- | --- |
| WWL | VCC | VPP | — | — |
| RWL | VCC | VCC | — | — |
| WBL | — | — | VPP | VCC |
| REN | — | — | VCC | 0 V |
| RBL | — | — | 0 V | Float |

In one embodiment of the present invention, supply voltage VCC is 3.3 Volts and programming voltage VPP is 6–7 Volts. Other embodiments may provide different supply and programming voltages.

Read Operation

During a read operation, word line control circuit 120 provides the VCC supply voltage to all write word lines WWL, and bit line control circuit 130 provides 0 Volts to all write bit lines WBL, thereby turning off all write access transistors 302. To read the state of a specific memory cell, such as memory cell 301(2,2), multiplexer 143 is set to provide a weak pull-up on the output line of memory system 300. In this manner, the voltages on the drains of transistors 141 are weakly pulled up to the VCC supply voltage. Additionally, bit line control circuit 130 asserts the VCC supply voltage on read enable line REN(2). Under these conditions, read output transistor 141(2) turns on, thereby coupling the associated read bit line RBL to the output line of memory system 300.

Note that bit line control circuit 130 provides 0 Volts on read enable lines REN associated with non-addressed columns. Consequently, transistors 141 in the non-addressed columns are turned off, thereby leaving their associated read bit lines RBL floating.

Word line control circuit 120 provides 0 Volts to all of the row word lines RWL in the non-addressed rows. Thus, read access transistors 304 in the non-addressed rows are turned off, thereby preventing the associated memory cells 303 from being read.

To read memory cell 301(2,2), word line control circuit 120 asserts the supply voltage VCC on read word line RWL(2). Under these conditions, read access transistors 304 in the addressed row turn on, thereby coupling the gates of the storage transistors 303 in that row to read bit lines RBL. However, only transistor 141(2) is conducting. In this manner, the drain of the read access transistor 304 in memory cell 301(2,2) is coupled to a weak pull-up (via multiplexer 343) as well as the output line of memory system 300.

If the storage transistor 303 of memory cell 301(2,2) is programmed, a conductive path will exist through storage transistor 303. Under these conditions, storage transistor 301 will overcome the weak pull-up provided via multiplexer 343 and pull down the voltage on read bit line RBL to approximately 0 Volts. Therefore, system 300 provides a logic low output signal OUT.

Conversely, if the storage transistor 303 of memory cell 301(2,2) is not programmed, no conductive path exists through storage transistor 303. Under these conditions, with no active pull down, multiplexer 343 pulls up the voltage of read bit line RBL to approximately VCC. Therefore, system 300 provides a logic high output signal OUT.

Table 4 summarizes the various voltages applied to the addressed and non-addressed rows and columns during a read operation.

TABLE 4

|  | Addressed Row | Non-Addressed Row | Addressed Column | Non-Addressed Column |
|---|---|---|---|---|
| WWL | VCC | VCC | — | — |
| RWL | VCC | 0 V | — | — |
| WBL | — | — | 0 V | 0 V |
| REN | — | — | VCC | 0 V |
| RBL | — | — | Coupled to Output Line | Float |

Although the invention has been described in connection with several embodiments, it is understood that this invention is not limited to the embodiments disclosed, but is capable of various modifications which would be apparent to a person skilled in the art. For example, memory system 300 can include other well known circuits to provide the necessary programming and read voltages. Moreover, the storage transistor of the present invention can be implemented independent of an array, and thus would not require the write access transistor and the storage transistor as described herein. Thus, the invention is limited only by the following claims.

What is claimed is:

1. A non-volatile memory cell comprising:
   a low voltage transistor having a gate, a source coupled to ground, and a drain, and
   a first high voltage transistor coupled to the drain of the low voltage transistor for reading the state of the memory cell, wherein a gate oxide of the first high voltage transistor is thicker than the gate oxide of the low voltage transistor.

2. The memory cell of claim 1, further including a second high voltage transistor for transferring a programming voltage to the gate of the low voltage transistor, wherein a gate oxide of the second high voltage transistor is thicker than the gate oxide of the low voltage transistor.

3. A non-volatile memory cell comprising:
   a write transistor;
   a read transistor; and
   a storage transistor, wherein a source of the storage transistor is coupled to a first voltage source and a drain of the storage transistor is connected to a drain of the read transistor, wherein a gate of the storage transistor is coupled to a drain of the write transistor, wherein a gate oxide of the write transistor and a gate oxide of the read transistor are thicker than a gate oxide of the storage transistor, and wherein the write, read, and storage transistors are standard CMOS devices.

4. The memory cell of claim 3, wherein a gate of the write transistor is coupled to a write word line, and a source of the write transistor is coupled to a write bit line.

5. The memory cell of claim 3, wherein a gate of the read transistor is coupled to a read word line, and a source of the read transistor is coupled to a read bit line.

6. The memory cell of claim 3, wherein the write transistor provides a programming voltage to the storage transistor.

7. The memory cell of claim 3, wherein the gate oxide of the storage transistor has a thickness of approximately 25 angstroms.

8. The memory cell of claim 3, wherein the gate oxide of the storage transistor is between approximately 15 and 40 angstroms.

9. The memory cell of claim 8, wherein the gate oxides of the write and read transistors are approximately 70 angstroms thick.

10. The memory cell of claim 3, wherein the write transistor is a PMOS device.

11. The memory cell of claim 3, wherein the read transistor is an NMOS device.

12. The memory cell of claim 3, wherein the storage transistor is an NMOS device.

13. The memory cell of claim 3, wherein the write transistor has a breakdown voltage that is greater than a breakdown voltage of the storage transistor.

14. A method of implementing a non-volatile memory cell in CMOS technology, the non-volatile memory cell including a low voltage transistor having a source, a drain, and a gate, the method comprising:
   applying a programming voltage to the gate of the low voltage transistor, wherein the programming voltage merges the source and the drain, thereby programming the non-volatile memory cell; and
   reading the low voltage transistor via the drain.

15. A method of implementing a non-volatile memory cell in CMOS technology, the non-volatile memory cell including a low voltage transistor having a source, a drain, and a gate, and a high voltage transistor coupled to the gate of the low voltage transistor, the high voltage transistor having a thicker gate oxide than the low voltage transistor, the method comprising:

using the high voltage transistor to apply a programming voltage to the gate of the low voltage transistor, wherein the programming voltage merges the source and the drain, thereby programming the non-volatile memory cell; and     reading the low voltage transistor via the drain.

16. A method of implementing a non-volatile memory cell in CMOS technology, the non-volatile memory cell including a low voltage transistor having a source, a drain, and a gate, and a high voltage transistor coupled to the drain of the low voltage transistor, the high voltage transistor having a thicker gate oxide than the low voltage transistor, the method comprising:

applying a programming voltage to the gate of the low voltage transistor, wherein the programming voltage merges the source and the drain, thereby programming the non-volatile memory cell; and     reading the low voltage transistor via the high voltage transistor.

17. A submicron antifuse comprising:

a transistor having a gate, a source coupled to ground, and a drain, wherein the antifuse is programmable by applying a programming voltage to the gate sufficient to merge the source and the drain.

18. The submicron antifuse of claim 17, wherein the transistor is read via the drain.

19. The submicron antifuse of claim 17, wherein the transistor is a low voltage device.

* * * * *